United States Patent
McCallion et al.

(10) Patent No.: US 7,962,045 B2
(45) Date of Patent: Jun. 14, 2011

(54) OPTICAL TRANSMITTER HAVING A WIDELY TUNABLE DIRECTLY MODULATED LASER AND PERIODIC OPTICAL SPECTRUM RESHAPING ELEMENT

(75) Inventors: Kevin John McCallion, Charlestown, MA (US); Yasuhiro Matsui, Woburn, MA (US); Daniel Mahgerefteh, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 678 days.

(21) Appl. No.: 11/964,315

(22) Filed: Dec. 26, 2007

(65) Prior Publication Data
US 2008/0166134 A1    Jul. 10, 2008

Related U.S. Application Data

(60) Provisional application No. 60/876,864, filed on Dec. 22, 2006, provisional application No. 60/879,430, filed on Jan. 9, 2007.

(51) Int. Cl.
*H04B 10/04* (2006.01)
*H04B 10/12* (2006.01)

(52) U.S. Cl. ........ 398/193; 398/185; 398/194; 398/199; 398/201

(58) Field of Classification Search .......... 398/183, 398/185, 193, 194, 199, 201
See application file for complete search history.

(56) References Cited

U.S. PATENT DOCUMENTS

| | | | |
|---|---|---|---|
| 3,324,295 A | 6/1967 | Harris | |
| 3,973,216 A | 8/1976 | Hughes et al. | |
| 3,999,105 A | 12/1976 | Archey et al. | |
| 4,038,600 A | 7/1977 | Thomas et al. | |
| 4,561,119 A | 12/1985 | Epworth | |
| 4,671,604 A | 6/1987 | Soref | |
| 4,754,459 A | 6/1988 | Westbrook | |
| 4,805,235 A | 2/1989 | Henmi | |
| 4,841,519 A | 6/1989 | Nishio | |
| 4,896,325 A | 1/1990 | Coldren | |

(Continued)

FOREIGN PATENT DOCUMENTS

CA    2510352    3/2010

(Continued)

OTHER PUBLICATIONS

Chirp managed laser (CML): A compact transmitter for dispersion tolerant 10 Gb/s networking applications; Mahgerefteh et al.; Optical Fiber Communication Conference, 2006 and the 2006 National Fiber Optic Engineers Conference. OFC 2006, Mar. 5-10, 2006; Digital Object Identifier: 10.1109/OFC.2006.215459.*

(Continued)

*Primary Examiner* — Nathan M Curs
(74) *Attorney, Agent, or Firm* — Maschoff Gilmore & Israelsen

(57) ABSTRACT

An optical transmitter is disclosed including a widely tunable laser coupled to a periodic optical spectrum reshaper (OSR) to convert frequency modulated pulses from the laser into amplitude modulated pulses. The laser is tuned to generate pulses corresponding to passbands of the OSR spanning a wide range of frequencies. The laser includes a gain section having an optical path length substantially shorter than the total optical path length of the laser. The laser may be a Y-branch laser having reverse-biased sampled gratings or ring resonator filters tuned by stripe heaters. The laser may also include a reflective external cavity section tunable by modulating the temperature of ring resonators or etalons. The OSR may be integrally formed with the external cavity of the ECL laser.

33 Claims, 6 Drawing Sheets

U.S. PATENT DOCUMENTS

| | | | |
|---|---|---|---|
| 4,908,883 A | 3/1990 | Chraplyvy et al. | |
| 4,914,667 A | 4/1990 | Blonder et al. | |
| 5,088,097 A | 2/1992 | Ono et al. | |
| 5,119,393 A | 6/1992 | Oka et al. | |
| 5,136,598 A | 8/1992 | Weller et al. | |
| 5,170,402 A | 12/1992 | Ogita et al. | |
| 5,177,630 A | 1/1993 | Goutzoulis et al. | |
| 5,293,545 A | 3/1994 | Huber | |
| 5,325,378 A | 6/1994 | Zorabedian | |
| 5,325,382 A | 6/1994 | Emura et al. | |
| 5,371,625 A | 12/1994 | Wedding et al. | |
| 5,394,429 A | 2/1995 | Yamada et al. | |
| 5,412,474 A | 5/1995 | Reasenberg et al. | |
| 5,416,629 A | 5/1995 | Huber | |
| 5,434,693 A | 7/1995 | Tanaka et al. | |
| 5,450,432 A | 9/1995 | Okuda | |
| 5,459,799 A | 10/1995 | Weber | |
| 5,465,264 A | 11/1995 | Buhler et al. | |
| 5,477,368 A | 12/1995 | Eskildsen et al. | |
| 5,550,667 A | 8/1996 | Krimmel et al. | |
| 5,568,311 A | 10/1996 | Matsumoto | |
| 5,592,327 A | 1/1997 | Gabl et al. | |
| 5,642,371 A | 6/1997 | Tohyama et al. | |
| 5,696,859 A | 12/1997 | Onaka et al. | |
| 5,737,104 A | 4/1998 | Lee et al. | |
| 5,777,773 A | 7/1998 | Epworth et al. | |
| 5,805,235 A | 9/1998 | Bedard | |
| 5,856,980 A | 1/1999 | Doyle | |
| 5,920,416 A | 7/1999 | Beylat et al. | |
| 5,946,129 A | 8/1999 | Xu et al. | |
| 5,953,139 A | 9/1999 | Nemecek et al. | |
| 5,953,361 A | 9/1999 | Borchert et al. | |
| 5,974,209 A | 10/1999 | Cho et al. | |
| 5,991,323 A | 11/1999 | Adams et al. | |
| 6,018,275 A | 1/2000 | Perrett et al. | |
| 6,081,361 A | 6/2000 | Adams et al. | |
| 6,088,373 A | 7/2000 | Hakki | |
| 6,091,743 A | 7/2000 | Yang | |
| 6,096,496 A | 8/2000 | Frankel | |
| 6,104,851 A | 8/2000 | Mahgerefteh | |
| 6,115,403 A | 9/2000 | Brenner et al. | |
| 6,148,017 A | 11/2000 | Borchert et al. | |
| 6,157,025 A | 12/2000 | Katagiri et al. | |
| 6,188,499 B1 | 2/2001 | Majima | |
| 6,222,861 B1 | 4/2001 | Kuo et al. | |
| 6,271,959 B1 | 8/2001 | Kim et al. | |
| 6,282,003 B1 | 8/2001 | Logan et al. | |
| 6,298,186 B1 | 10/2001 | He | |
| 6,331,991 B1 | 12/2001 | Mahgerefteh | |
| 6,351,585 B1 | 2/2002 | Amundson et al. | |
| 6,353,623 B1 | 3/2002 | Munks et al. | |
| 6,359,716 B1 | 3/2002 | Taylor | |
| 6,421,151 B1 | 7/2002 | Berger et al. | |
| 6,459,518 B1 | 10/2002 | Suzuki et al. | |
| 6,473,214 B1 | 10/2002 | Roberts et al. | |
| 6,486,440 B1 | 11/2002 | Crafts et al. | |
| 6,506,342 B1 | 1/2003 | Frankel | |
| 6,522,809 B1 | 2/2003 | Takabayashi et al. | |
| 6,563,623 B1 | 5/2003 | Penninckx et al. | |
| 6,577,013 B1 | 6/2003 | Glenn et al. | |
| 6,580,739 B1 | 6/2003 | Coldren | |
| 6,618,513 B2 | 9/2003 | Evankow, Jr. | |
| 6,628,690 B1 | 9/2003 | Fish et al. | |
| 6,650,667 B2 | 11/2003 | Nasu et al. | |
| 6,654,564 B1 | 11/2003 | Colbourne et al. | |
| 6,658,031 B2 | 12/2003 | Tuganov et al. | |
| 6,665,351 B2 | 12/2003 | Hedberg et al. | |
| 6,687,278 B1 | 2/2004 | Mason et al. | |
| 6,690,686 B2 | 2/2004 | Delfyett | |
| 6,738,398 B2 | 5/2004 | Hirata | |
| 6,748,133 B2 | 6/2004 | Liu et al. | |
| 6,778,307 B2 | 8/2004 | Clark | |
| 6,785,308 B2 | 8/2004 | Dyer et al. | |
| 6,807,215 B2 | 10/2004 | Lam et al. | |
| 6,810,047 B2 | 10/2004 | Oh et al. | |
| 6,815,786 B2 | 11/2004 | Ogasawara et al. | |
| 6,834,134 B2 | 12/2004 | Brennan et al. | |
| 6,836,487 B1 | 12/2004 | Farmer et al. | |
| 6,847,758 B1 | 1/2005 | Watanabe | |
| 6,943,951 B2 | 9/2005 | Kikuchi et al. | |
| 6,947,206 B2 | 9/2005 | Tsadka et al. | |
| 6,963,685 B2 | 11/2005 | Mahgerefteh et al. | |
| 7,013,090 B2 | 3/2006 | Adachi et al. | |
| 7,027,470 B2 | 4/2006 | May | |
| 7,054,538 B2 | 5/2006 | Mahgerefteh et al. | |
| 7,073,956 B1 | 7/2006 | Shin et al. | |
| 7,076,170 B2 | 7/2006 | Choa | |
| 7,123,846 B2 | 10/2006 | Tateyama et al. | |
| 7,164,865 B2 | 1/2007 | Tatsuno et al. | |
| 7,187,821 B2 | 3/2007 | Matsui et al. | |
| 7,263,291 B2 | 8/2007 | Mahgerefteh et al. | |
| 7,280,721 B2 | 10/2007 | McCallion et al. | |
| 7,352,968 B2 | 4/2008 | Tayebati | |
| 7,356,264 B2 | 4/2008 | Mahgerefteh et al. | |
| 7,376,352 B2 | 5/2008 | Tayebati | |
| 7,406,266 B2 | 7/2008 | Mahgerefteh et al. | |
| 7,406,267 B2 | 7/2008 | Mahgerefteh et al. | |
| 7,433,605 B2 | 10/2008 | Mahgerefteh et al. | |
| 7,474,858 B2 | 1/2009 | Lee et al. | |
| 7,474,859 B2 | 1/2009 | Mahgerefteh et al. | |
| 7,477,851 B2 | 1/2009 | Mahgerefteh et al. | |
| 7,480,464 B2 | 1/2009 | McCallion et al. | |
| 7,492,976 B2 | 2/2009 | Mahgerefteh et al. | |
| 7,502,532 B2 | 3/2009 | McCallion et al. | |
| 7,505,694 B2 | 3/2009 | Johnson et al. | |
| 7,515,626 B2 | 4/2009 | Lee et al. | |
| 7,536,113 B2 | 5/2009 | Matsui et al. | |
| 7,542,683 B2 | 6/2009 | Matsui et al. | |
| 7,555,225 B2 | 6/2009 | Mahgerefteh et al. | |
| 7,558,488 B2 | 7/2009 | Matsui et al. | |
| 7,564,889 B2 | 7/2009 | Matsui et al. | |
| 7,609,977 B2 | 10/2009 | Matsui et al. | |
| 7,613,401 B2 | 11/2009 | Matsui et al. | |
| 7,616,902 B2 | 11/2009 | Mahgerefteh et al. | |
| 7,630,425 B2 | 12/2009 | Tayebati et al. | |
| 7,639,955 B2 | 12/2009 | Zheng et al. | |
| 7,657,179 B2 | 2/2010 | Mahgerefteh et al. | |
| 7,663,762 B2 | 2/2010 | Mahgerefteh et al. | |
| 7,697,186 B2 | 4/2010 | McCallion et al. | |
| 7,697,847 B2 | 4/2010 | Matsui et al. | |
| 7,742,542 B2 | 6/2010 | Mahgerefteh et al. | |
| 7,760,777 B2 | 7/2010 | Matsui et al. | |
| 7,778,295 B2 | 8/2010 | Matsui et al. | |
| 7,809,280 B2 | 10/2010 | Mahgerefteh et al. | |
| 7,860,404 B2 | 12/2010 | Matsui et al. | |
| 2001/0012430 A1 | 8/2001 | Usami et al. | |
| 2001/0048705 A1 | 12/2001 | Kitaoka et al. | |
| 2002/0002099 A1 | 1/2002 | Hara et al. | |
| 2002/0012369 A1 | 1/2002 | Nasu et al. | |
| 2002/0044738 A1 | 4/2002 | Jablonski | |
| 2002/0048290 A1 | 4/2002 | Tanaka et al. | |
| 2002/0063930 A1 | 5/2002 | Blauvelt | |
| 2002/0131047 A1 | 9/2002 | Zarrabian et al. | |
| 2002/0154372 A1 | 10/2002 | Chung et al. | |
| 2002/0159490 A1 | 10/2002 | Karwacki | |
| 2002/0176659 A1 | 11/2002 | Lei et al. | |
| 2003/0002120 A1 | 1/2003 | Choa | |
| 2003/0063647 A1 | 4/2003 | Yoshida et al. | |
| 2003/0067952 A1 | 4/2003 | Tsukiji et al. | |
| 2003/0077031 A1 | 4/2003 | Zhang et al. | |
| 2003/0099018 A1 | 5/2003 | Singh et al. | |
| 2003/0147114 A1 | 8/2003 | Kang et al. | |
| 2003/0161370 A1 | 8/2003 | Buimovich et al. | |
| 2003/0169787 A1 | 9/2003 | Vergaftman et al. | |
| 2003/0193974 A1 | 10/2003 | Frankel et al. | |
| 2003/0210912 A1 | 11/2003 | Leuthold | |
| 2004/0008933 A1 | 1/2004 | Mahgerefteh et al. | |
| 2004/0008937 A1 | 1/2004 | Mahgerefteh et al. | |
| 2004/0036943 A1 | 2/2004 | Freund et al. | |
| 2004/0076199 A1 | 4/2004 | Wipiejewski et al. | |
| 2004/0081386 A1 | 4/2004 | Morse et al. | |
| 2004/0086012 A1* | 5/2004 | Kitaoka et al. | 372/43 |
| 2004/0096221 A1 | 5/2004 | Mahgerefteh et al. | |
| 2004/0218890 A1 | 11/2004 | Mahgerefteh et al. | |
| 2004/0234200 A1 | 11/2004 | Jennings et al. | |
| 2005/0100345 A1 | 5/2005 | Welch et al. | |
| 2005/0111852 A1 | 5/2005 | Mahgerefteh et al. | |

| | | | |
|---|---|---|---|
| 2005/0152702 | A1 | 7/2005 | Mahgerefteh et al. |
| 2005/0163512 | A1 | 7/2005 | Tayebati et al. |
| 2005/0169638 | A1 | 8/2005 | Tayebati et al. |
| 2005/0169642 | A1 | 8/2005 | Mahgerefteh et al. |
| 2005/0175356 | A1* | 8/2005 | McCallion et al. ........... 398/187 |
| 2005/0196177 | A1 | 9/2005 | Moran |
| 2005/0206989 | A1 | 9/2005 | Marsh |
| 2005/0213993 | A1 | 9/2005 | Kazemi-Nia et al. |
| 2005/0249509 | A1 | 11/2005 | Nagarajan et al. |
| 2005/0271394 | A1 | 12/2005 | Whiteaway et al. |
| 2005/0286829 | A1 | 12/2005 | Mahgerefteh et al. |
| 2005/0286909 | A1 | 12/2005 | Kish et al. |
| 2006/0002718 | A1 | 1/2006 | Matsui et al. |
| 2006/0008272 | A1 | 1/2006 | Abeles |
| 2006/0018666 | A1 | 1/2006 | Matsui et al. |
| 2006/0029358 | A1 | 2/2006 | Mahgerefteh et al. |
| 2006/0029396 | A1* | 2/2006 | Mahgerefteh et al. ........ 398/186 |
| 2006/0029397 | A1 | 2/2006 | Mahgerefteh et al. |
| 2006/0078338 | A1 | 4/2006 | Johnson et al. |
| 2006/0120416 | A1 | 6/2006 | Hu et al. |
| 2006/0193636 | A1 | 8/2006 | Katagiri et al. |
| 2006/0228120 | A9 | 10/2006 | McCallion et al. |
| 2006/0233556 | A1 | 10/2006 | Mahgerefteh et al. |
| 2006/0239306 | A1 | 10/2006 | Donanhoe |
| 2006/0274993 | A1 | 12/2006 | Mahgerefteh et al. |
| 2007/0286608 | A1 | 12/2007 | Matsui et al. |
| 2008/0002990 | A1 | 1/2008 | McCallion et al. |
| 2008/0037608 | A1 | 2/2008 | Zhou et al. |
| 2008/0159747 | A1 | 7/2008 | Mahgerefteh et al. |
| 2008/0181619 | A1 | 7/2008 | Heismann |
| 2008/0187325 | A1 | 8/2008 | McCallion et al. |
| 2008/0193132 | A1 | 8/2008 | Matsui et al. |
| 2008/0193144 | A1 | 8/2008 | Zhou et al. |
| 2008/0240180 | A1 | 10/2008 | Matsui et al. |
| 2008/0247763 | A1 | 10/2008 | Mahgerefteh et al. |
| 2008/0247765 | A1 | 10/2008 | Mahgerefteh et al. |
| 2008/0291950 | A1 | 11/2008 | McCallion et al. |
| 2009/0003842 | A1 | 1/2009 | Mahgerefteh et al. |
| 2009/0060526 | A1 | 3/2009 | Matsui et al. |
| 2009/0080905 | A1 | 3/2009 | Olsson |
| 2009/0196631 | A1 | 8/2009 | Daghighian et al. |
| 2009/0238224 | A1 | 9/2009 | Ye |
| 2009/0269069 | A1 | 10/2009 | Mahgerefteh et al. |
| 2010/0008679 | A1 | 1/2010 | Cole |
| 2010/0098436 | A1 | 4/2010 | Mahgerefteh et al. |
| 2010/0279447 | A1 | 11/2010 | Matsui et al. |
| 2010/0311195 | A1 | 12/2010 | Matsui et al. |

FOREIGN PATENT DOCUMENTS

| | | |
|---|---|---|
| CN | 1236891 | 12/1999 |
| CN | 200380108289.9 | 11/2007 |
| CN | 200380108289.9 | 8/2008 |
| CN | 200380108289.9 | 11/2008 |
| CN | 200580015245.0 | 9/2009 |
| CN | 200580012705.4 | 3/2010 |
| CN | 200580015245.0 | 3/2010 |
| CN | 200580037807 | 5/2010 |
| CN | 200880009551.7 | 7/2010 |
| EP | 052758 | 7/1992 |
| EP | 602659 | 6/1994 |
| EP | 05731268.8 | 1/2008 |
| EP | 05764209.2 | 6/2009 |
| EP | 05731268.8 | 5/2010 |
| GB | 2 107 147 | 4/1983 |
| JP | 58-075340 | 5/1983 |
| JP | 62-189832 | 8/1987 |
| JP | 09-214427 | 8/1997 |
| JP | 11-031859 | 2/1999 |
| JP | 2000105313 | 4/2000 |
| JP | 2001-036477 | 2/2001 |
| JP | 2001-284711 | 10/2001 |
| JP | 2001291928 | 10/2001 |
| JP | 2001320328 | 11/2001 |
| JP | 2002243935 | 8/2002 |
| JP | 2002267834 | 9/2002 |
| JP | 2002267998 | 9/2002 |
| JP | 2002-311235 | 10/2002 |
| JP | 2004-551835 | 7/2008 |
| JP | 2004-551835 | 3/2010 |
| JP | 2009-504345 | 4/2010 |
| JP | 2009-504345 | 10/2010 |
| KR | 102008-7027139 | 4/2010 |
| WO | 9905804 | 2/1999 |
| WO | 0104999 | 1/2001 |
| WO | WO 0117076 | 3/2001 |
| WO | WO 0118919 | 3/2001 |
| WO | 03005512 | 1/2003 |

OTHER PUBLICATIONS

State-of-the-art performance of widely tunable modulated grating Y-branch lasers; Wesstrom et al.; Optical Fiber Communication Conference, 2004. OFC 2004, vol. 1, No., pp. 2 vol. (1800), Feb. 23-27, 2004; doi: 10.1109/OFC.2004.1359295.*

Alexander et al., Passive Equalization of Semiconductor Diode Laser Frequency Modulation, Journal of Lightwave Technology, Jan. 11-23, 1989, vol. 7, No. 1.

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutal1 et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-μm InGaAl As Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

U.S. Appl. No. 12/047,017, Mail Date Sep. 27, 2010, Notice of Allowance.

U.S. Appl. No. 12/025,573, Mail Date Oct. 6, 2010, Office Action.

U.S. Appl. No. 12/014,676, Mail Date Oct. 4, 2010, Office Action.

U.S. Appl. No. 12/115,337, Mail Date Oct. 28, 2010, Notice of Allowance.

U.S. Appl. No. 12/017,957, Mail Date Nov. 5, 2010, Office Action.

U.S. Appl. No. 12/028,675, Mail Date Oct. 27, 2010, Office Action.

U.S. Appl. No. 12/028,675, Mail Date Dec. 8, 2010, Office Action.

U.S. Appl. No. 12/053,344, Mail Date Apr. 1, 2010, Office Action.

U.S. Appl. No. 12/184,137, Mail Date Dec. 2, 2010, Notice of Allowance.

Dischler, Roman, Buchali, Fred, Experimental Assessment of a Direct Detection Optical OFDM System Targeting 10Gb/s and Beyond, Optical Fiber Communication/National Fiber Optic Engineers Conference, Feb. 24-28, 3 pages, San Diego, CA, 2008.

Dong Jae Shin, et al., Low-cost WDM-PON with Colorless Bidirectional Tranceivers, Journal of Lightwave Technology, Jan. 2006, pp. 158-165, vol. 24, No. 1.

Kikuchi, Nobuhiko, et al., Experimental Demonstration of Incoherent Optical Multilevel Staggered-APSK (Amplitude- and Phase-Shift Keying) Signaling, Optical Fiber Communication/National Fiber Optic Engineers Conference, Feb. 24-28, 2008, 3 pages, San Diego, CA.

Kiyoshi Fukuchi, Proposal and Feasibility Study of a 6-level PSK modulation format based system for 100 Gg/s migration, 2007, 3 pages.

Lammert et al., MQW DBR Lasers with Monolithically Integrated External-Cavity Electroabsorption Modulators Fabricated Without Modification of the Active Region, IEEE Photonics Technology Letters, vol. 9, No. 5, May 1997, pp. 566-568.

Mahgerefteh, D. and Fan, F., Chirp-managed-laser technology delivers > 250-km reach, Lightwave Online, 2005, PennWell Corporation. Accessed online Jul. 1, 2009 at: http://www.finisar.com/download_31wMeaCML_Application%20White%20Paper-LW.pdf.

Ronald Freund, Dirk Daniel Gross, Matthias Seimetz, Lutz Molle, Christoph Casper, 30 Gbit/s RZ 8-PSK Transmission over 2800 km Standard Single Mode Fibre without Inline Dispersion Compensation, 2007, 3 pages.

Tokle, Torger et al., Advanced Modulation Formats for Transmission Systems, Optical Fiber Communication/National Fiber Optic Engineers Conference, Feb. 24-28, 2008, 3 pages, San Diego, CA.

Sekine, Kenro, et al., Advanced Multi-level Transmission Systems, Optical Fiber Communication/National Fiber Optic Engineers Conference, Feb. 24-28, 2008, 3 pages, San Diego, CA.

U.S. Appl. No. 11/964,321, Mail Date Aug. 25, 2010, Office Action.

U.S. Appl. No. 12/115,337, Mail Date Mar. 4, 2010, Office Action.

U.S. Appl. No. 12/115,337, Mail Date Aug. 20, 2010, Office Action.

U.S. Appl. No. 12/047,017, Mail Date Jun. 1, 2010, Restriction Requirement.

U.S. Appl. No. 12/047017, Mail Date Aug. 6, 2010, Office Action.

U.S. Appl. No. 12/053,344, Mail Date Sep. 3, 2010, Notice of Allowance.

* cited by examiner

To tune, injection currents to PC, SG1, and SG2 are adjusted.

OPTICAL TRANSMITTER HAVING A WIDELY TUNABLE DIRECTLY MODULATED LASER AND PERIODIC OPTICAL SPECTRUM RESHAPING ELEMENT

CROSS-REFERENCE TO RELATED APPLICATIONS

This application claims the benefit of U.S. Provisional Application Ser. No. 60/876,864, filed Dec. 22, 2006, and U.S. Provisional Application Ser. No. 60/879,430, filed Jan. 9, 2007, which are hereby incorporated by reference.

BACKGROUND OF THE INVENTION

1. The Field of the Invention

The present invention is directed to optical transmitters.

2. The Relevant Technology

In some laser transmitters, a laser is operated at a high bias level and modulated to produce adiabatically chirped pulses that are modulated both as to frequency and amplitude. An optical spectrum reshaper (OSR) having a frequency dependent transmission profile receives the output of the laser and outputs a signal having an enhanced amplitude modulation. The OSR increases the extinction ratio by converting frequency modulation to amplitude modulation.

In such systems, rapid frequency modulation is required. Although many lasers may be tuned to different frequencies, not all may be frequency modulated at data rates in excess of 10 gigabits per second (Gb/s). Furthermore, lasers capable of adequate frequency modulation rates are either not capable of doing so across a broad range of carrier frequencies or do not produce pulses suitable for use in such systems.

In view of the foregoing it would be an advancement in the art to provide a directly modulated tunable laser suitable for use in combination with an OSR at data rates in excess of 10 Gb/s and over a broad range of frequencies.

BRIEF SUMMARY OF THE INVENTION

In one aspect of the invention, an optical transmitter includes a tunable laser that is tunable across a first frequency range. An optical spectrum reshaper (OSR) is positioned to receive an output of the laser and has a plurality of periodic passbands located within the first frequency range. A controller coupled to the tunable laser is programmed to cause the laser to emit adiabatically chirped pulses having a peak frequency located within a first of the plurality of passbands and to subsequently tune the laser to produce adiabatically chirped pulses having a peak frequency located within a second of the plurality of passbands, different from the first passband.

In another aspect of the invention, the laser has a gain section having an optical path length substantially less than the total path length of the laser. For example, the laser may have an optical path length that is between about two and five times that of the gain section.

In another aspect of the invention, the laser includes a gain section coupled to first and second sampled gratings by an optical power splitter. The sampled gratings may be reverse-biased to facilitate the generation of high data rate adiabatic pulses. The laser may be tuned by changing the temperature of the sampled gratings according to the thermo-optic effect.

In another aspect of the invention, the laser includes a gain section coupled to a ring resonator section. The ring resonators are coupled to stripe heaters for independently changing the frequency response of the ring resonators. In some embodiments, the ring resonators are formed on a chip coupled to a laser formed on a different chip.

In another aspect of the invention the OSR is formed on the same chip as the ring resonators and optically coupled to the lasing portion; and wherein heaters are coupled to the first and second rings, respectively, the controller being operable to tune the laser by independently adjusting the temperature of the heaters.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
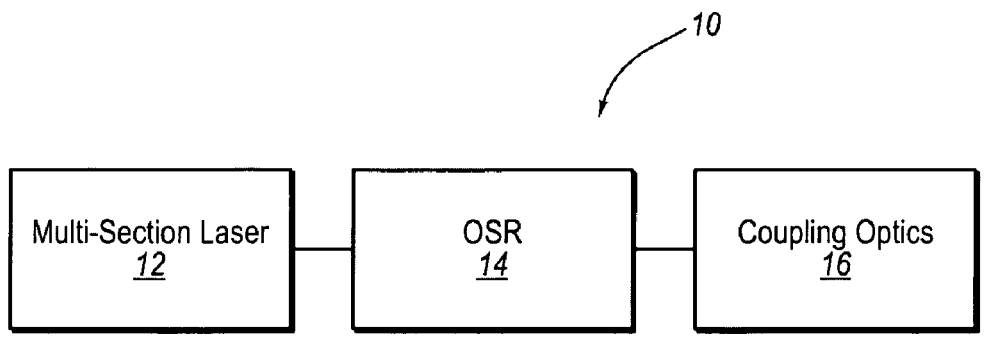
FIG. 1 illustrates a widely tunable transmitter system in accordance with an embodiment of the present invention.

Referring to FIG. 1, an optical transmitter module 10 includes a multi-section laser 12 coupled to an optical spectrum reshaper (OSR) 14. The output of the OSR is coupled to coupling optics 16, such as a fiber pigtail, for coupling the transmitter to an optical fiber. The OSR 14 converts a frequency modulated signal from the laser 12 to an amplitude modulated signal. In some embodiments, the output of the laser is both frequency and amplitude modulated, such as adiabatically chirped pulses produced by a directly modulated laser 12 embodied as a distributed feedback (DFB) laser. The output of the OSR may also remain somewhat frequency modulated. The OSR may be embodied as one or more filters, including, but not limited to, a coupled multi-cavity (CMC)

filter, a periodic multi-cavity etalon, a fiber Bragg grating, a ring resonator filter or any other optical element having a wavelength-dependent loss. The OSR 14 may also comprise a fiber, a Gire-Tournois interferometer, or some other element with chromatic dispersion.

A widely tunable transmitter module 10 in accordance with an embodiment of the invention can be implemented via 10 Gb/s, or greater, direct modulation of a widely tunable multi-section laser 12 together with a periodic spectral filtering element (i.e. OSR) 14. In one embodiment, a monolithic integrated InP (Indium Phosphorus) chip structure with high speed gain section response and on-chip phase control section plus Vernier-type reflective filtering element(s) is used. In another embodiment, an external cavity laser (ECL) structure that uses a high speed InP gain section plus an integrated optic chip containing a Vernier-type reflective filtering element and optional phase control section is used.

Each of the above approaches provides the same laser functions i.e. gain and phase control and a widely tunable wavelength selective reflector. Other criteria such as ease of fabrication, testing yield, power consumption, output power level, speed of tuning, etc. may be used to determine which is best for a given application.

It is important that directly modulated lasers used in combination with an OSR produce sufficiently high speed adiabatic chirp, such as can be obtained from the multi-section tunable laser. Other basic requirements are that the gain section response time is sufficiently fast, the laser intrinsic speed does not limit performance, and the RC time constant of the gain section is short enough. Furthermore, these parameters are preferably maintained over full C band tuning.

To guarantee high speed performance and also minimize dilution of the laser adiabatic chirp, it is important to keep the laser cavity length short. In a preferred embodiment, the multi section laser includes a gain section that is relatively short compared to the overall optical path length of the laser. In some embodiments, the total optical length of the laser is between two and five times that of the gain section. In other embodiments, the total optical length of the laser is greater than three times that of the gain section. In some embodiments, the laser includes a resonator portion and a gain section, where the resonator portion has an optical path length more than twice that of the gain section.

Figure 2:
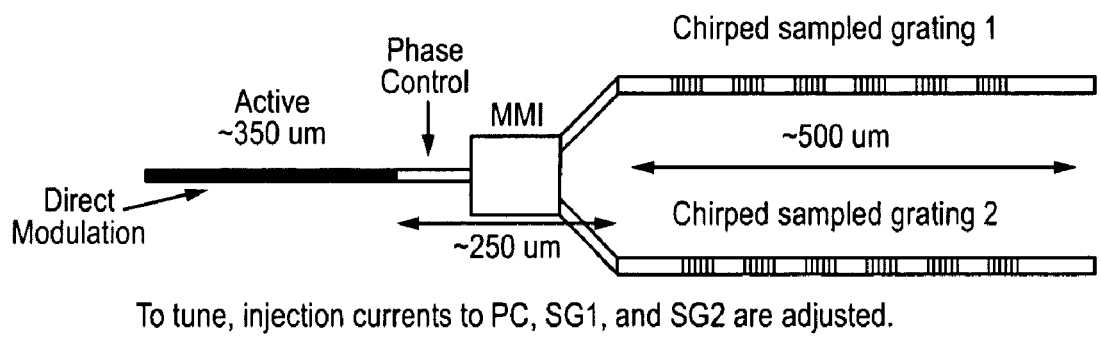
FIG. 2 illustrates a Y-branch laser suitable for use in the widely tunable transmitter system in accordance with an embodiment of the present invention.
Figure 2:
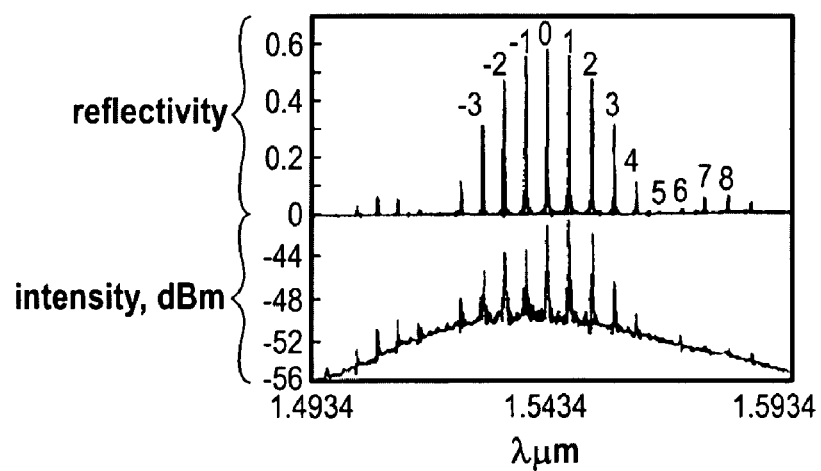

A short laser cavity can be achieved in commercially available InP monolithic multi-section lasers, typically supplied by JDSU and Syntune. The laser structures shown in FIGS. 2-7 are examples of multi-section or external cavity lasers that can be used in combination with an OSR to convert a frequency modulated signal, such as an adiabatically chirped signal, to a signal having enhanced amplitude modulation, extinction ratio, and phase relationship between pulses. FIG. 2 shows a monolithic InP-based device structure similar to that used by Syntune Corporation of Sweden. The dimensions of the various sections are typical values.

The system of FIG. 2 includes a gain section 18, a phase control section 20, and a "Y-branch" structure including two independently tunable end mirrors 22, or sampled gratings 22, coupled to the phase control section 20 by means of an optical power splitter 24. The end mirrors 22 are embodied as chirped sampled gratings, which may be tuned by the thermo-optic effect or by current injection. For thermal tuning, stripe heaters 26 are positioned adjacent the sampled gratings 22 for tuning their reflection spectrum.

The system of FIG. 2 may be formed on a monolithic multi-section chip. Alternatively, the gain section 18 may be embodied as a Fabry-Perot (FP) laser formed of InP coupled to a silicon, or silicon-on-insulator, chip bearing the Y-branch structure.

Figure 3:
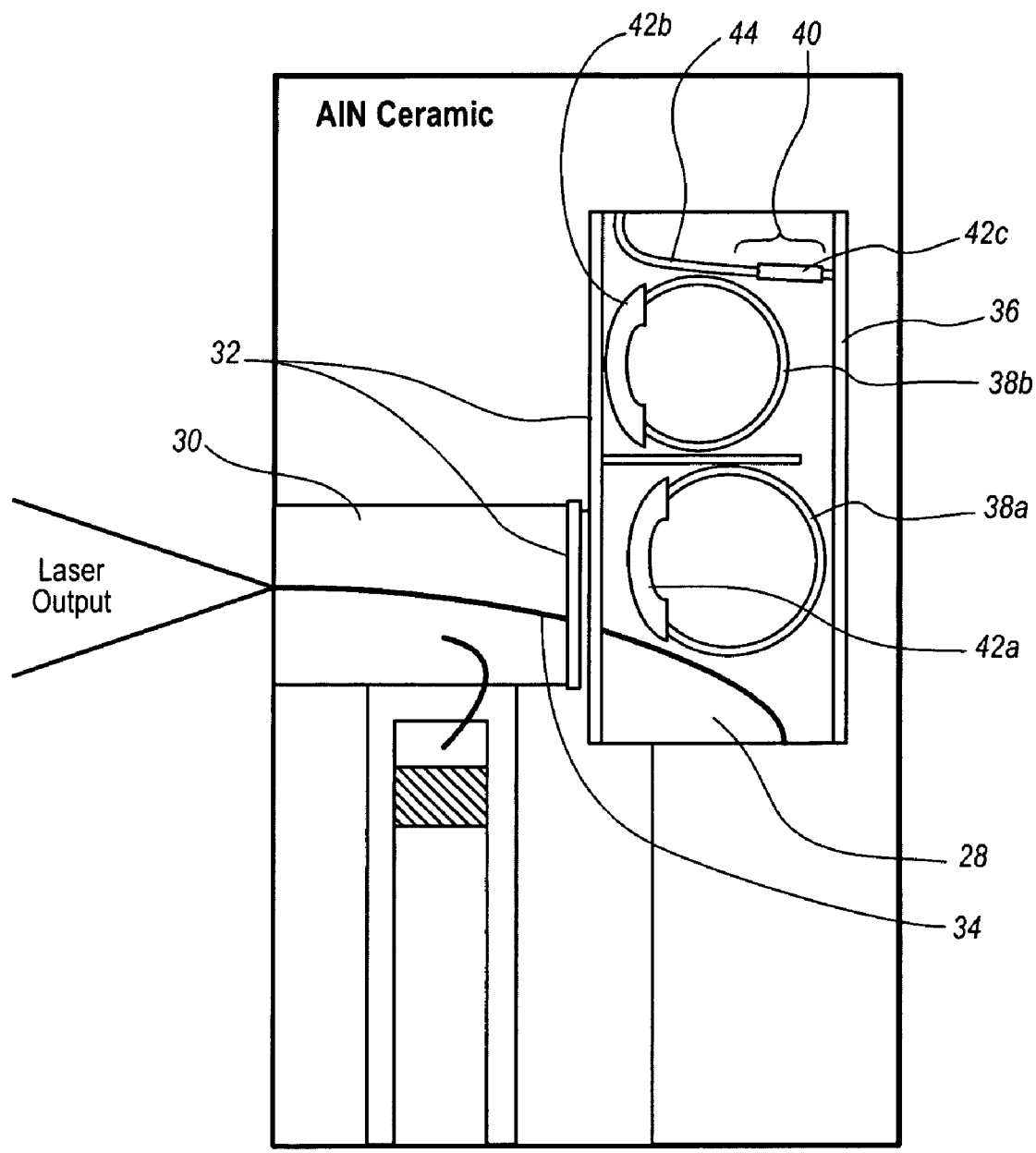
FIG. 3 illustrates a external cavity laser suitable for use in the widely tunable transmitter system in accordance with an embodiment of the present invention.

FIG. 3 illustrates a hybrid InP-Silicon external cavity laser device wherein a Silicon chip 28 is butt-coupled directly to a FP-type laser diode 30 fabricated in InP. Other fabrication materials may also be used for the silicon chip 28, such as silicon-on-insulator, silica-on-silicon, or Hydex (LittleOptics proprietary material).

One or both of the FP laser chip 30 and silicon chip 28 have an anti-reflection coating 32 at the interface between the chips. Furthermore, both chips 28, 30 are angled with respect to the direction of a laser waveguide 34 to ensure extremely low back-reflections and thereby minimize sub-cavity effects in the laser mode structure. A reflective coating 36 may be formed on the silicon chip facet opposite to the anti-reflection coating 32.

The silicon chip 28 may include two cascaded waveguide ring resonator filters 38a, 38b and a waveguide phase section 40. In some embodiments, the phase section 40 is integrated with the FP laser chip 30. The phase section 40 may also be located before or after the ring resonator filters 38a, 38b on the silicon chip 28.

Each ring resonator filter 38a, 38b and the phase section 40 may be controlled by a separate stripe heater 42a-42c. This allows wide Vernier-type tuning and also fine-tuning of the cavity mode structure. The Silicon chip 28 may be designed to have a mode-match to the waveguide 34 of the FP laser to allow for low-loss coupling therebetween. A waveguide 44 may direct optical signals from the ring resonator filter 32b and transmit optical signals to the reflective coating 36, where they are reflected back through the cavity. In some embodiments, the phase section is a portion of the waveguide 44 located adjacent to the stripe heater 42c. The assembled laser chip 30 and silicon chip 28 may be placed on a micro-cooler during operation.

Figure 4:
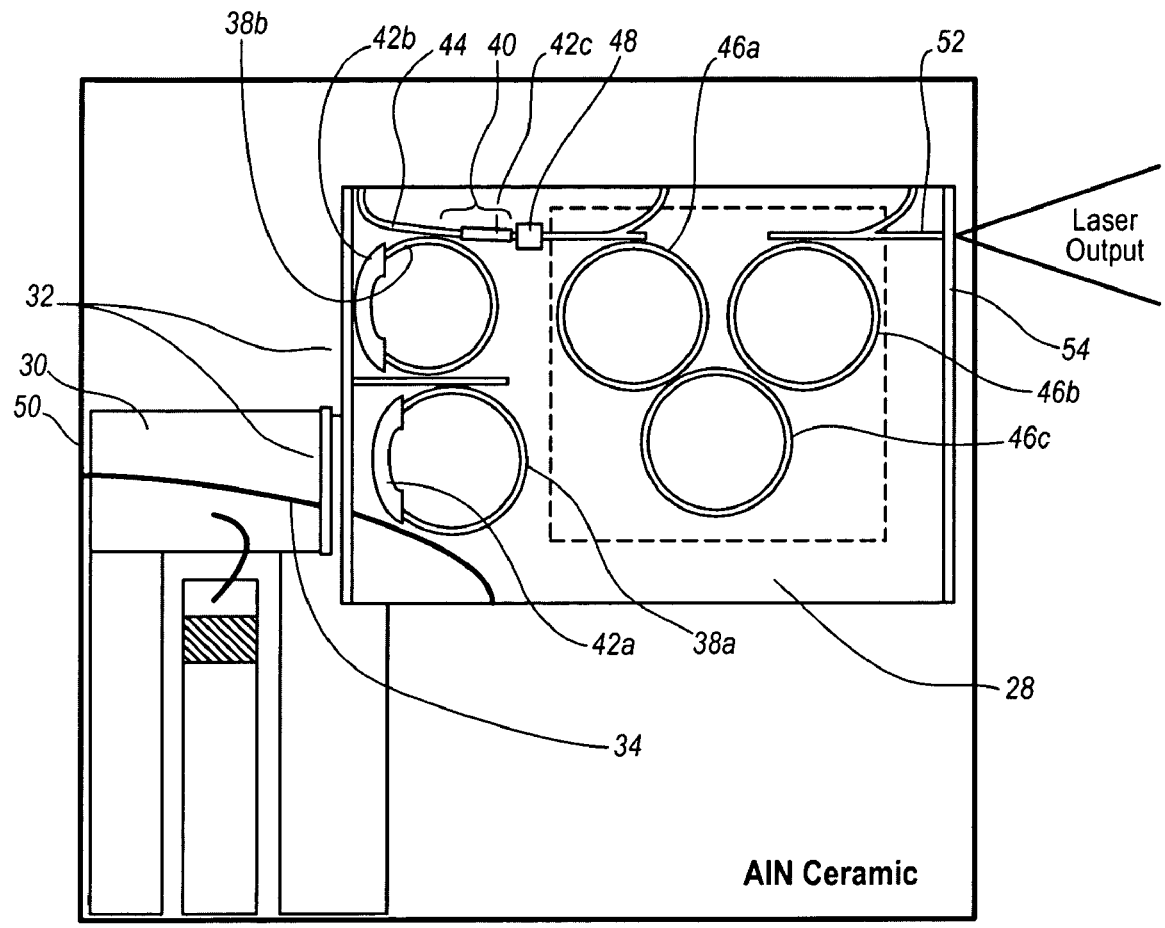
FIG. 4 illustrates an external cavity laser having an integrated optical spectrum reshaper suitable for use in the widely tunable transmitter system in accordance with an embodiment of the present invention.

Referring to FIG. 4, in an alternative embodiment, the silicon chip 28 includes the OSR 14, in the form of multiple ring resonator filters 46a-46c coupled to the waveguide 44. An output coupler 48 is disposed between the waveguide 44 and the resonator rings 46a-46c to reflect a portion of optical power transmitted through the waveguide 44 back to the FP laser chip 30. The laser chip 30 may bear a reflective coating 50 opposite the anti-reflection coating 32 such that optical energy is output through the OSR 14. An output waveguide 52 transmits optical signals from the OSR 14 through an anti-reflection coating 54.

Figure 5:
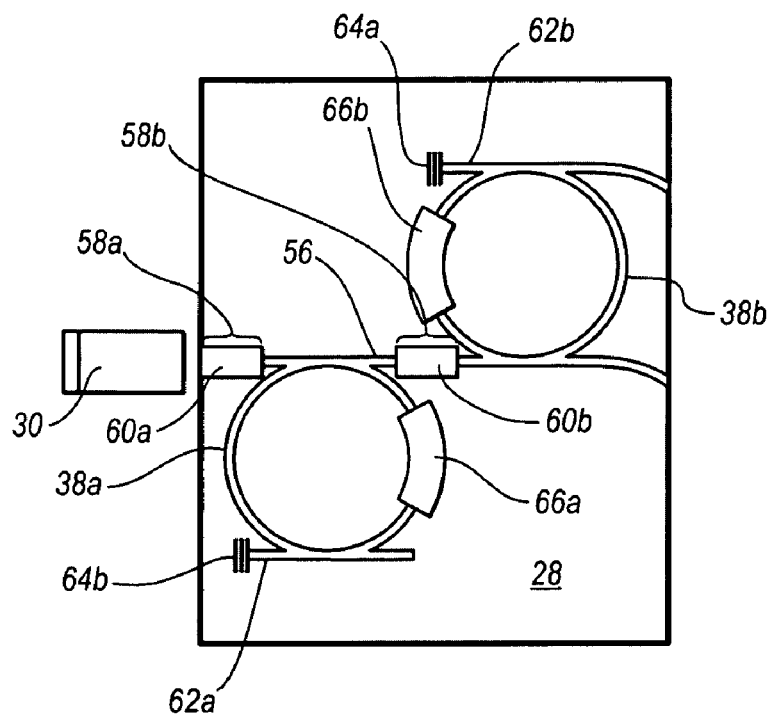
FIG. 5 illustrates an alternative external cavity laser suitable for use in the widely tunable transmitter system in accordance with an embodiment of the present invention.

Referring to FIG. 5, in another alternative embodiment, a laser chip 30 is coupled to a central waveguide 56. The ring resonator filters 38a, 38b each couple light from the central waveguide 56 at different positions. In some embodiments, a phase control section 58a, 58b is positioned before each resonator ring filter 38a, 38b. The phase control sections 58a, 58b may be embodied as stripe heaters 60a, 60b positioned over portions of the central waveguide 56. Light from the ring resonator filters 38a, 38b is coupled to waveguides 62a, 62b which direct light to highly reflective mirrors 64a, 64b. Tuning of the ring resonator filters 38a, 38b may be accomplished by means of a stripe heater 66a, 66b positioned over at least a portion of each resonator ring filter 38a, 38b.

Figure 6:
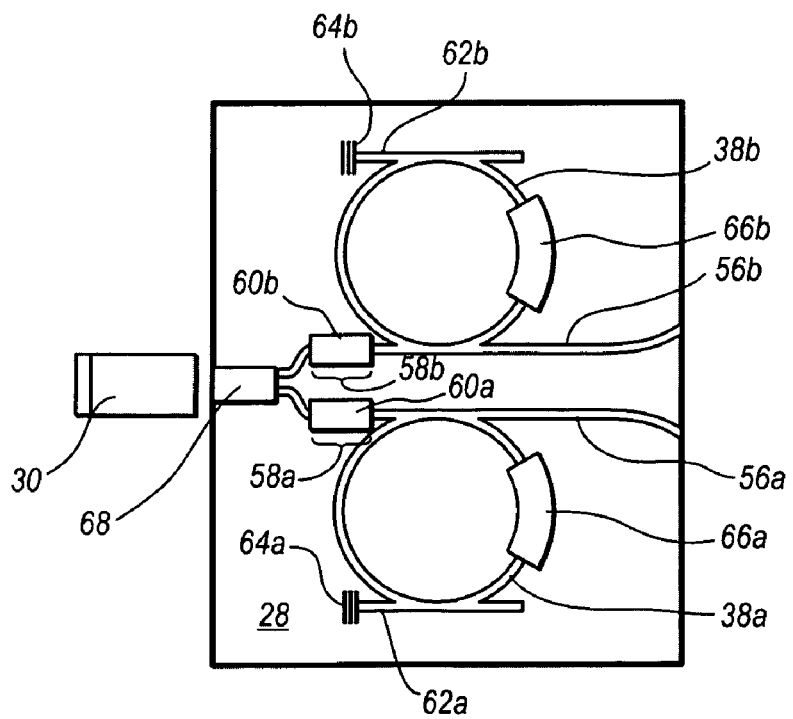
FIG. 6 illustrates another alternative external cavity laser suitable for use in the widely tunable transmitter system in accordance with an embodiment of the present invention.

Referring to FIG. 6, in yet another alternative embodiment, the central waveguide 56 is replaced with parallel waveguides 56a, 56b coupled to the laser chip 30 by means of an optical power splitter 68, such as a multi mode interface (MMI). Each resonator ring filter 38a, 38b is coupled to one of the parallel waveguides 56*a*, 56*b*. The phase control sections 58*a*, 58*b* may likewise each be coupled to one of the parallel waveguides 56*a*, 56*b*.

Figure 7:
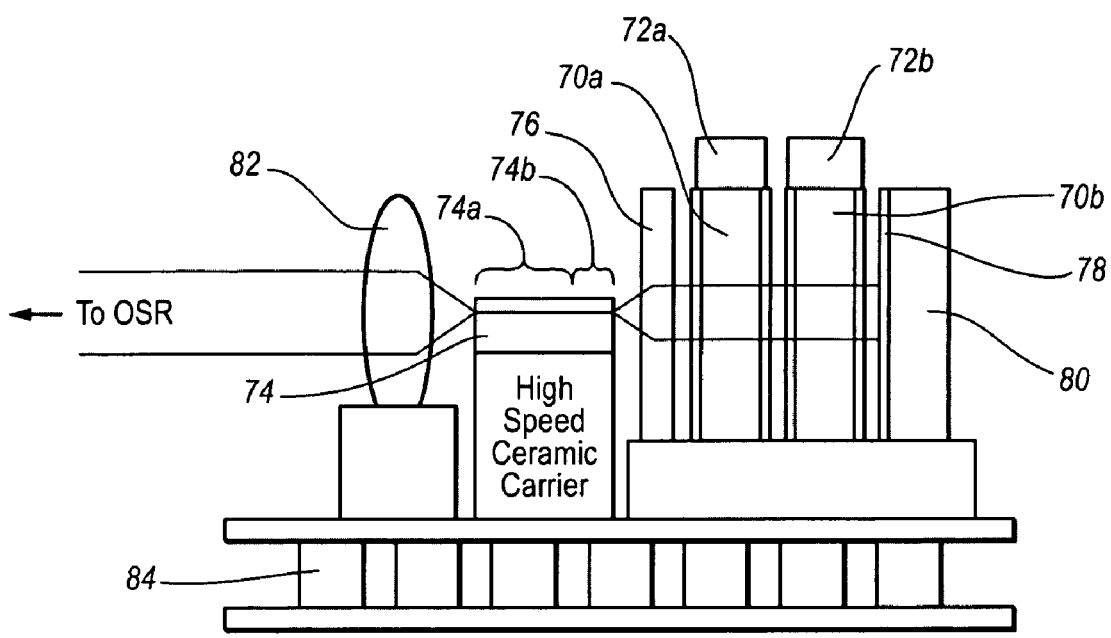
FIG. 7 illustrates still another alternative external cavity laser suitable for use in the widely tunable transmitter system in accordance with an embodiment of the present invention.

Referring to FIG. 7, in another alternative embodiment, the multi section laser 12 includes an external cavity including multiple etalons 70*a*, 70*b*, preferably two. The etalons 70*a*, 70*b* are formed of silicon and may include coatings and other treatments as known in the art. Alternatively, the etalons may be formed from other materials with advantageous thermo-optic coefficients including Indium Phosphide, Gallium Arsenide, optical polymer materials, and various optical crystals. Heaters 72*a*, 72*b* may be coupled to each etalon 70*a*, 70*b* for tuning the frequency response of the etalons and thereby change the frequency of the laser using the Vernier effect. In the embodiment of FIG. 7, a gain chip 74 is coupled to the etalons 70*a*, 70*b* by a lens 76, preferably a short focal length silicon lens that collimates the output of the laser to the etalons. In a preferred embodiment, the lens 76 is a diffractive lens that provides a shorter path length than a conventional lens. The gain chip 74 may be formed on a high speed ceramic carrier or like substrate. In some embodiments, the gain chip includes a gain portion 74*a* and a phase portion 74*b* that is independently controllable to adjust the phase within the laser cavity.

A cavity mirror 78 reflects light back through the etalons and may include an anti-reflection coating 80 opposite its reflecting surface. An output lens 82 collimates the output of the laser directed away from the external cavity for coupling to other optics, including an OSR 14, or other components suitable for enhancing one or more of the amplitude modulation, extinction ratio, and phase correlation, of an adiabatically chirped signal. In the illustrated embodiment, the etalons 70*a*, 70*b*, gain section 74, lens 76, cavity mirror 78, and output lens 82, are separated from other components by an air gap. The components of the multi section laser 12 may also all be mounted on a thermo-electric cooler (TEC) 84 to facilitate consistent operation.

In the multi-section laser examples of FIGS. 2-7, the laser end mirrors provide two periodic reflection spectrums that can be independently controlled. By utilizing the Vernier effect, widely tunable narrowband reflection can be produced which leads to stable single-longitudinal mode lasing with good side mode suppression ration (SMSR). The phase section is used to fine-tune the overall cavity mode structure for optimum performance of the laser.

The laser cavity must be short to ensure sufficiently fast response time for 10 Gbs modulation and also to minimize dilution of the adiabatic chirp in order to generate adiabatically chirped pulses that can be converted by an OSR into pulses having enhanced amplitude modulation, extinction ratio, and/or phase relationship between pulses. In particular, the ratio of the gain section optical length to the remaining cavity optical length should be as large as possible. This is due to the fact that the gain section is the preferred section that can be modulated to provide a cavity phase change at 10 Gb/s data rates. Since, only the phase change in this section contributes to the overall laser adiabatic chirp, the resulting frequency shift is diluted by the rest of the laser cavity.

For an external cavity laser structure, an advantageous means for retaining a short cavity length is to use a butt-coupling technique as shown in FIGS. 3-6. The use of a conventional lens element for coupling between hybrid chips necessitates a significantly extended cavity length and reduces the possibility of 10 Gbs modulation. However, as shown in FIG. 7, a diffractive lens may be used without excessively increasing the cavity length.

Figure 8:
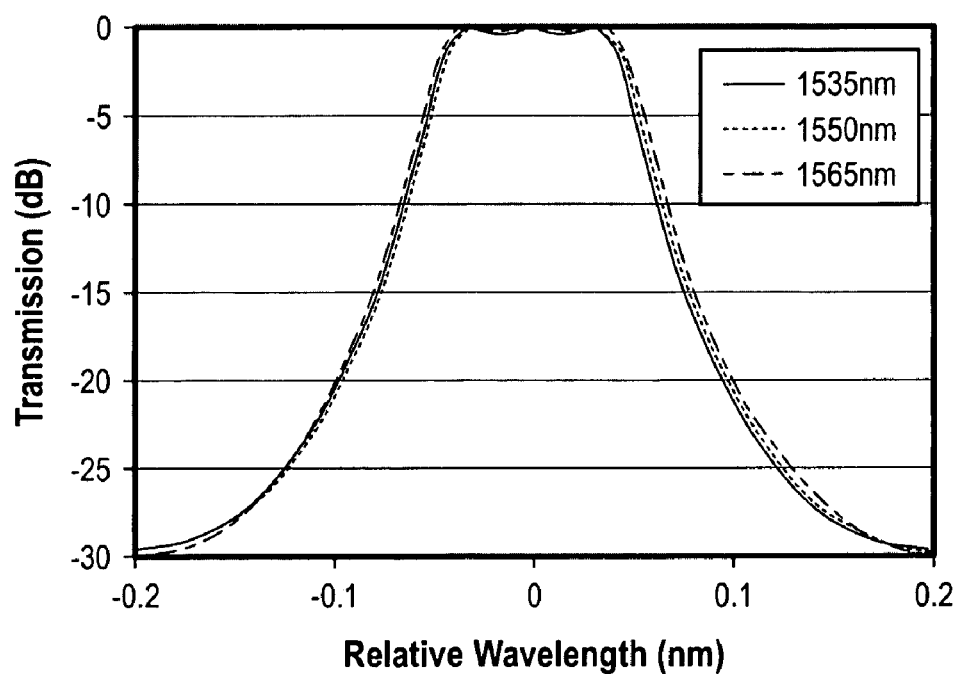
FIG. 8 illustrates the spectral response of a typical OSR component.

Referring to FIG. 8, the widely tunable multi-section lasers described above are used together with a periodic optical spectral re-shaper (OSR) 14 to enhance the amplitude modulation, extinction ratio, and/or phase relationship between pulses of adiabatically chirped pulses or other frequency modulated pulses. This is similar to the operation of a directly modulated standard DFB laser used in combination with an OSR to generate pulses with enhanced amplitude modulation relative to the output of the laser. During operation, the tunable lasers described with respect to FIGS. 2-7 are tuned such that they are biased to generate a base frequency and are modulated to generate adiabatic pulses having a peak frequency excursion above or below the base frequency. The rising or falling edge of one of the passbands is preferably located between the base and peak frequency of the adiabatic pulses such that one or more of the amplitude modulation, extinction ratio, and phase relationship between pulses is improved, however other relative positions are possible in order to output different pulse shapes from the OSR.

The laser 12 and/or the passband of the OSR 14 may be tuned according to systems and methods described in, for example, application Ser. No. 11/084,630, filed Mar. 18, 2005 and entitled "Flat-topped Chirp Induced by Optical Filter edge"; application Ser. No. 11/084,633, filed Mar. 18, 2005 and entitled "Method and Apparatus for Transmitting a Signal Using Simultaneous FM and AM Modulation"; and application Ser. No. 11/068,032, filed Feb. 28, 2005 and entitled "Optical System Comprising an FM Source and a Spectral Reshaping Element," all of which are hereby incorporated by reference. Other systems and methods for pulse generation and reshaping for improved transmission performance may also be used.

In some embodiments, a locking circuit as described in application Ser. No. 10/308,522, filed Feb. 8, 2005 and entitled "Power Source for a Dispersion Compensation Fiber Optic System," which is hereby incorporated by reference, may be used to lock the base frequency of the laser proximate one passband and subsequently lock the base frequency proximate another passband of the OSR. Due to the widely tunable range of the laser, the locking circuit may be used to lock the base frequency proximate a plurality of passbands, such as passbands separated from one another by about 50% of the C Band, preferably between 80 and 100% of the C band, and more preferably between 90 and 100% of the C band.

As shown in FIG. 8, the OSR preferably has a number of passbands across a wide frequency band, such as the C band. As further shown in FIG. 8, the passbands have identical shape, particularly the slope of their rising and falling edges. The OSR may also be designed with, for example, a 50 GHz free spectral range (FSR) so that the operating point on each passband can easily be tuned to coincide with the International Telecommunication Union (ITU) grid by means of a small temperature adjustment.

The chirp management requirements for multi-section lasers described above depend to some extent on the selection of tuning method used in different versions of the technology. For example, in monolithic versions such as that shown in FIG. 2, experiments conducted by the inventors have found that the adiabatic chirp response is influenced by the normal forward biasing of the sampled grating sections 22. The forward biasing is generally used as an efficient and low power consumption method of laser tuning but the injection of free carriers into these regions causes absorption of the intra-cavity optical energy. This, in turn, leads to undesirable phase and frequency variations on a slower time scale. It is found that this can be avoided by reverse biasing of these sections and performing tuning of the sampled gratings via localized Joule heating. The reverse-bias causes some additional loss but removes the free-carrier population and associated "slow" frequency variations. In some embodiments, forward biasing is still used to modulate the phase control sections 20, 40, 58a, 58b, and 74b.

An alternative approach to tuning of the sampled grating regions 22 of FIG. 2, or other periodic reflectors, such as the ring resonator filters 36a, 36b of FIGS. 3-6, and the etalons 70a, 70b of FIG. 7, is to use the thermo-optic effect. InP-based materials exhibit a large temperature dependence of the refractive index, sufficiently large to be used for tuning with low power consumption. Localized heating is possible using stripe heaters deposited directly onto the grating regions 22, the ring resonator filters 36a, 36b, or etalons 70a, 70b, which may be formed in a monolithic multi-section chip. This avoids free-carrier injection and corresponding degradation of the laser chirp properties. In addition, designing the material of the sampled grating 22, ring resonator filters 36a, 36b, etalons 70a, 70b, and other waveguide structures to exhibit low propagation loss by means of the avoidance of reverse-biasing described above also helps to maintain low loss in the reflector sections. This approach can allow higher optical output power operation of the laser. Tuning of the laser may also be accomplished by variation of the reverse bias level in the sampled grating regions 22, ring resonator filters 36a, 36b, or etalons 70a, 70b, thereby causing a change in Joule heating. Stripe heaters may also be used for tuning the phase control sections 20, 40, 58a, 58b, and 74b.

Figure 9:
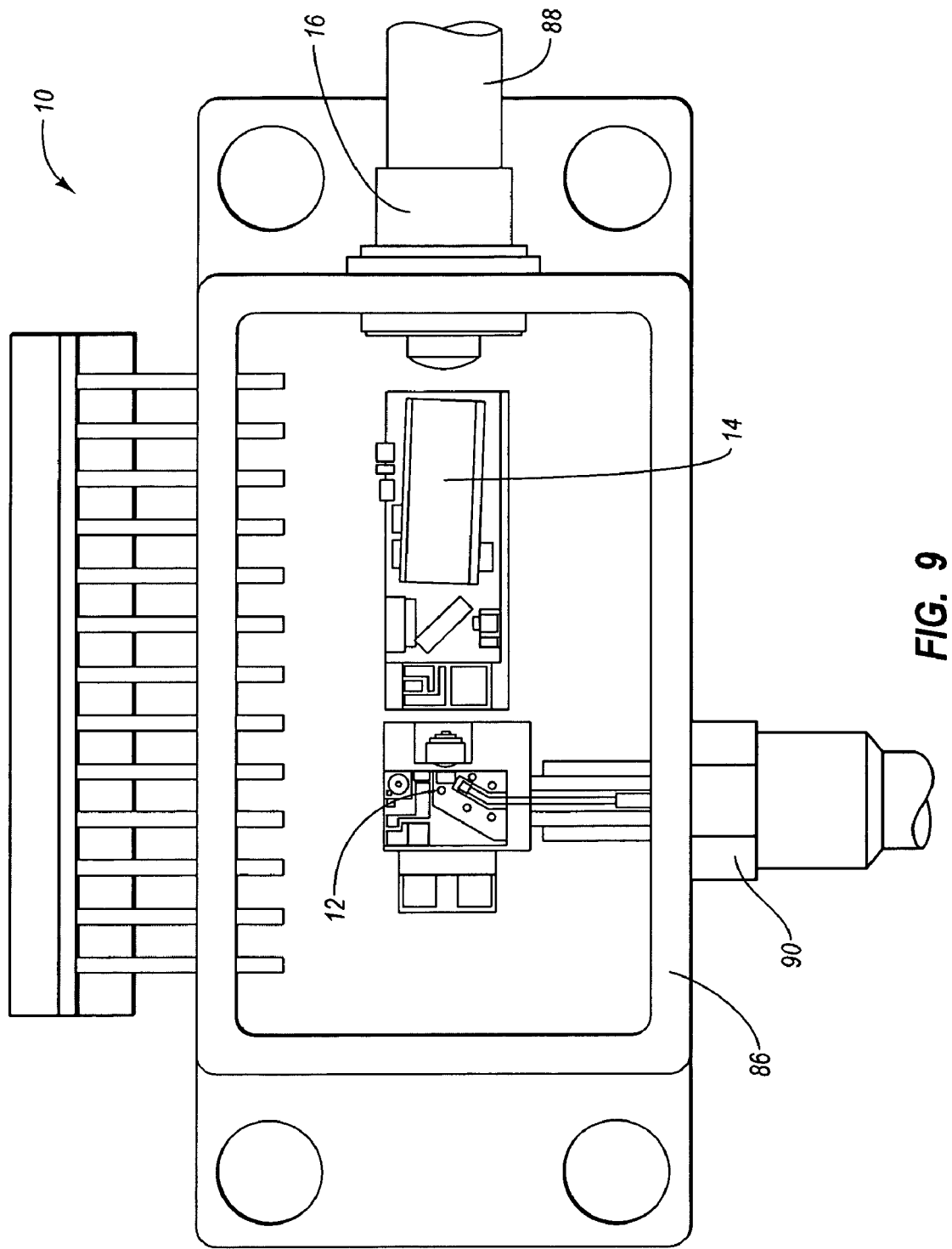
FIG. 9 illustrates the physical layout of a widely tunable transmitter in accordance with an embodiment of the present invention.

Referring to FIG. 9, in some embodiments, the transmitter 10 is encased within a housing 86 having a chip bearing the multi section laser 12 and the OSR 14 secured thereto. The coupling optics 16 enable securement of a fiber optic cable 88 to the housing 86 in optical communication with the OSR 14. An external modulator (not shown) is coupled to an input 90 of the transmitter 10 and supplies a data signal. The external modulator may also provide control signals for tuning the laser 12, the OSR 14, such as by independently changing the temperature of elements within the laser 12.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transmitter comprising:
a directly modulated laser tunable across a first frequency range;
an optical spectrum reshaper positioned to receive an output of the directly modulated laser and having a plurality of periodic passbands, the plurality of passbands located within the first frequency range; and
a controller coupled to the tunable directly modulated laser and programmed to cause the directly modulated laser to emit first adiabatically chirped pulses having a peak frequency located within a first of the plurality of passbands and to cause the directly modulated laser to emit second adiabatically chirped pulses having a peak frequency located within a second of the plurality of passbands different from the first of the plurality of passbands;
wherein the directly modulated laser includes a gain section coupled to first and second sampled gratings by an optical power splitter and wherein the sampled gratings are formed in a semiconductor material and are reverse-biased.

2. The optical transmitter of claim 1, wherein the directly modulated laser comprises a gain section, the directly modulated laser having a total optical path length substantially greater than that of the gain section.

3. The optical transmitter of claim 2, wherein the directly modulated laser has a total optical path length of between about two and five times that of the gain section.

4. The optical transmitter of claim 3, wherein the directly modulated laser has a total optical path length greater than about three times that of the gain section.

5. The optical transmitter of claim 1, wherein the sampled gratings are chirped sampled gratings.

6. The optical transmitter of claim 1, further comprising first and second heaters proximate the first and second sampled gratings, respectively; wherein the controller is operable to tune the directly modulated laser by independently adjusting the temperature of the heaters.

7. The optical transmitter of claim 1, wherein the first and second of the plurality of passbands are separated from one another by 50% of the width of the C band.

8. The optical transmitter of claim 7, wherein the first and second of the plurality of passbands are separated from one another by more than 80% of the width of the C band.

9. An optical transmitter comprising:
a directly modulated laser tunable across a first frequency range;
an optical spectrum reshaper positioned to receive an output of the directly modulated laser and having a plurality of periodic passbands, the plurality of passbands located within the first frequency range; and
a controller coupled to the tunable directly modulated laser and programmed to cause the directly modulated laser to emit first adiabatically chirped pulses having a peak frequency located within a first of the plurality of passbands and to cause the directly modulated laser to emit second adiabatically chirped pulses having a peak frequency located within a second of the plurality of passbands different from the first of the plurality of passbands;
wherein:
the directly modulated laser comprises a gain portion coupled to a ring resonator portion;
the gain portion is butt-coupled to the ring resonator portion; and
the gain portion is a Fabry-Perot directly modulated laser chip.

10. The optical transmitter of claim 9, wherein the ring resonator portion is formed in a semiconductor material.

11. The optical transmitter of claim 9, wherein the gain portion includes InP optical components.

12. The optical transmitter of claim 9, wherein the ring resonator portion includes first and second rings optically coupled to the gain portion; and wherein heaters are coupled to the first and second rings, respectively, the controller being operable to tune the directly modulated laser by independently adjusting the temperature of the heaters.

13. The optical transmitter of claim 9, further comprising an optical power splitter having an input coupled to the gain portion and two outputs; and wherein the ring resonator portion includes first and second rings each optically coupled to one of the outputs.

14. The optical transmitter of claim 9, further comprising at least one anti-reflection surface between the gain portion and the ring resonator portion.

15. The optical transmitter of claim 9, wherein the ring resonator portion is embedded in a semiconductor substrate and wherein the optical spectrum reshaper is formed in the semiconductor substrate in optical communication with the ring resonator portion.

16. The optical transmitter of claim 15, wherein the optical spectrum reshaper comprises a plurality of resonator rings in optical communication with the ring resonator portion.

17. The optical transmitter of claim 15, further comprising an output coupler disposed between the ring resonator portion and the optical spectrum reshaper.

18. The optical transmitter of claim 9, wherein the directly modulated laser has a total optical path length greater than about two times that of the gain portion.

19. The optical transmitter of claim 9, wherein the first and second of the plurality of passbands are separated from one another by more than 80% of the width of the C band.

20. An optical transmitter comprising:
a directly modulated laser tunable across a first frequency range;
an optical spectrum reshaper positioned to receive an output of the directly modulated laser and having a plurality of periodic passbands, the plurality of passbands located within the first frequency range; and
a controller coupled to the tunable directly modulated laser and programmed to cause the directly modulated laser to emit first adiabatically chirped pulses having a peak frequency located within a first of the plurality of passbands and to cause the directly modulated laser to emit second adiabatically chirped pulses having a peak frequency located within a second of the plurality of passbands different from the first of the plurality of passbands;
wherein the directly modulated laser includes a gain section and an external cavity comprising multiple etalons and multiple heaters each coupled to a respective one of the multiple etalons.

21. The optical transmitter of claim 20, further comprising a lens positioned between the gain section and the multiple etalons.

22. The optical transmitter of claim 20, wherein the directly modulated laser has a total optical path length between about two and five times that of the gain section.

23. The optical transmitter of claim 20, wherein the first and second of the plurality of passbands are separated from one another by more than 80% of the width of the C band.

24. A method for transmitting optical signals comprising:
causing a directly modulated laser to emit a first adiabatic pulse having a frequency excursion from a first base frequency to a first peak frequency;
transmitting the first adiabatic pulse to an optical spectrum reshaper having a plurality of passbands, the first peak frequency lying within a first passband of the plurality of passbands;
tuning the directly modulated laser to emit a second adiabatic pulse having a frequency excursion from a second base frequency to a second peak frequency, the second peak frequency lying within a second passband of the plurality of passbands; and
tuning the optical spectrum reshaper to shift the first and second passbands.

25. The method of claim 24, wherein the first base frequency is further from a peak transmission frequency of the first passband than the first peak frequency.

26. The method of claim 24, wherein causing the directly modulated laser to emit the first and second adiabatic pulses comprises passing optical signals through a gain section and a resonator portion, the resonator portion having an optical path length substantially greater than the gain section.

27. The method of claim 24, wherein the directly modulated laser includes a gain section and an external cavity, the external cavity having an optical path length greater than about two times that of the gain section.

28. The method of claim 24, wherein the first and second of the plurality of passbands are separated from one another by 50% of the width of the C band.

29. The method of claim 24, wherein the first and second of the plurality of passbands are separated from one another by more than 80% of the width of the C band.

30. A method for transmitting optical signals comprising:
causing a directly modulated laser to emit a first adiabatic pulse having a frequency excursion from a first base frequency to a first peak frequency;
transmitting the first adiabatic pulse to an optical spectrum reshaper having a plurality of passbands, the first peak frequency lying within a first passband of the plurality of passbands; and
tuning the directly modulated laser to emit a second adiabatic pulse having a frequency excursion from a second base frequency to a second peak frequency, the second peak frequency lying within a second passband of the plurality of passbands;
wherein:
causing the directly modulated laser to emit the first adiabatic pulse comprises passing optical signals through a gain section and first and second sampled gratings coupled to the gain section by an optical power splitter; and
tuning the directly modulated laser to emit the second adiabatic pulse comprises independently changing a temperature of the first and second sampled gratings.

31. The method of claim 30, further comprising reverse-biasing the first and second sampled gratings.

32. A method for transmitting optical signals comprising:
causing a directly modulated laser to emit a first adiabatic pulse having a frequency excursion from a first base frequency to a first peak frequency;
transmitting the first adiabatic pulse to an optical spectrum reshaper having a plurality of passbands, the first peak frequency lying within a first passband of the plurality of passbands; and
tuning the directly modulated laser to emit a second adiabatic pulse having a frequency excursion from a second base frequency to a second peak frequency, the second peak frequency lying within a second passband of the plurality of passbands;
wherein:
causing the directly modulated laser to emit the first adiabatic pulse comprises passing optical signals through a gain section and first and second ring resonators coupled to the gain section; and
tuning the directly modulated laser to emit the second adiabatic pulse comprises changing a temperature of at least a portion of the first and second ring resonators independently from one another.

33. A method for transmitting optical signals comprising:
causing a directly modulated laser to emit a first adiabatic pulse having a frequency excursion from a first base frequency to a first peak frequency;
transmitting the first adiabatic pulse to an optical spectrum reshaper having a plurality of passbands, the first peak frequency lying within a first passband of the plurality of passbands; and tuning the directly modulated laser to emit a second adiabatic pulse having a frequency excursion from a second base frequency to a second peak frequency, the second peak frequency lying within a second passband of the plurality of passbands;

wherein:

causing the directly modulated laser to emit the first adiabatic pulse comprises passing optical signals through a gain section and first and second etalons coupled to the gain section and separated from one another by an air gap; and tuning the directly modulated laser to emit the second adiabatic pulse comprises changing a temperature of at least a portion of the first and second etalons independently from one another.

* * * * *